(12) United States Patent
Lou

(10) Patent No.: US 9,373,650 B2
(45) Date of Patent: Jun. 21, 2016

(54) TFT ARRAY SUBSTRATE, MANUFACTURING METHOD THEREOF AND DISPLAY PANEL

(71) Applicants: Shanghai Tianma Micro-Electronics Co., Ltd., Shanghai (CN); Tianma Micro-Electronics Co., Ltd., Shenzhen (CN)

(72) Inventor: Junhui Lou, Shanghai (CN)

(73) Assignees: Shanghai Tianma Micro-Electronics Co., Ltd., Shanghai (CN); Tianma Micro-Electronics Co., Ltd., Shenzhen (CN)

(*) Notice: Subject to any disclaimer, the term of this patent is extended or adjusted under 35 U.S.C. 154(b) by 0 days.

(21) Appl. No.: 14/223,966

(22) Filed: Mar. 24, 2014

(65) Prior Publication Data

US 2015/0102337 A1 Apr. 16, 2015

(30) Foreign Application Priority Data

Oct. 14, 2013 (CN) .......................... 2013 1 0476913

(51) Int. Cl.
*H01L 27/12* (2006.01)
*H01L 49/02* (2006.01)

(52) U.S. Cl.
CPC .......... *H01L 27/1255* (2013.01); *H01L 27/124* (2013.01); *H01L 27/1259* (2013.01); *H01L 28/60* (2013.01)

(58) Field of Classification Search
CPC .................... H01L 27/1255; H01L 27/124
USPC .................... 257/43, 59, 71, 72, 257
See application file for complete search history.

(56) References Cited

U.S. PATENT DOCUMENTS

| 5,737,049 A | 4/1998 | Shin et al. |
| 2009/0027579 A1* | 1/2009 | Aota ................. G02F 1/134363 349/41 |

FOREIGN PATENT DOCUMENTS

| CN | 1832118 A | 9/2006 |
| CN | 102651401 A | 8/2012 |
| CN | 103262250 A | 8/2013 |

\* cited by examiner

*Primary Examiner* — Chuong A Luu
*Assistant Examiner* — Rodolfo Fortich
(74) *Attorney, Agent, or Firm* — Alston & Bird LLP

(57) ABSTRACT

A TFT array substrate is disclosed. The TFT array substrate includes a TFT area, which includes a TFT first electrode layer, a TFT second electrode layer, a TFT insulation layer, and a TFT etching stop layer. The TFT array substrate also includes also includes a storage capacitor, which includes a capacitor first electrode layer, a capacitor second electrode layer, a capacitor insulation layer, and a capacitor etching stop layer. The TFT first electrode layer and the capacitor first electrode layer are formed in a shared first electrode layer, the TFT second electrode layer and the capacitor second electrode layer are formed in a shared second electrode layer, the TFT insulation layer and the capacitor insulation layer are formed in a shared insulation layer, and the TFT etching stop layer and the capacitor etching stop layer are formed in a shared etching stop layer.

16 Claims, 8 Drawing Sheets

TFT ARRAY SUBSTRATE, MANUFACTURING METHOD THEREOF AND DISPLAY PANEL

CROSS-REFERENCES TO RELATED APPLICATIONS

This application claims the benefit of priority to Chinese Patent Application No. 201310476913.6, filed with the Chinese Patent Office on Oct. 14, 2013 and entitled "TFT ARRAY SUBSTRATE, MANUFACTURING METHOD THEREOF AND DISPLAY PANEL", the content of which is incorporated herein by reference in its entirety.

FIELD OF THE INVENTION

The present invention relates to the field of display devices, and in particularly to a TFT array substrate, a manufacturing method for the TFT array substrate and a display panel employing the TFT array substrate.

BACKGROUND OF THE INVENTION

A plurality of Thin Film Transistors (TFTs) are integrated in a TFT array substrate to drive the pixels in a Liquid Crystal Display (LCD) or Organic Light-Emitting Diode (OLED) display panel, for displaying an image on the display panel in combination with periphery driving circuitry. Accordingly, the TFTs, which are switches for controlling the light emitting, are critical for implementing the image display, and are directly involved in the development trend of the display panel. However, in a TFT array substrate of the display panel in the prior art, the area of a storage capacitor is overlapped with a gate insulator layer, leading to a thick structure formed by various stacked dielectric layers, so that the capacitance of the storage capacitor is accordingly decreased and is insufficient, and the parasitic capacitance is increased, thus affecting the image display quality.

BRIEF SUMMARY OF THE INVENTION

One inventive aspect is a TFT array substrate. The TFT array substrate includes a TFT area, and the TFT area includes a TFT first electrode layer, a TFT second electrode layer, a TFT insulation layer, and a TFT etching stop layer. The TFT array substrate also includes also includes a storage capacitor in a storage capacitor area, the storage capacitor including a capacitor first electrode layer, a capacitor second electrode layer, a capacitor insulation layer, and a capacitor etching stop layer. The TFT first electrode layer and the capacitor first electrode layer are formed in a shared first electrode layer, the TFT second electrode layer and the capacitor second electrode layer are formed in a shared second electrode layer, the TFT insulation layer and the capacitor insulation layer are formed in a shared insulation layer, and the TFT etching stop layer and the capacitor etching stop layer are formed in a shared etching stop layer. In addition, the shared first electrode layer, the shared etching stop layer, and the shared second electrode layer are sequentially stacked.

Another inventive aspect is a display panel. The display panel includes a TFT array substrate, and the TFT array substrate includes a TFT area. The TFT area includes a TFT first electrode layer, a TFT second electrode layer, a TFT insulation layer, and a TFT etching stop layer. The TFT area also includes a storage capacitor in a storage capacitor area, where the storage capacitor includes a capacitor first electrode layer, a capacitor second electrode layer, a capacitor insulation layer, and a capacitor etching stop layer. The TFT first electrode layer and the capacitor first electrode layer are formed in a shared first electrode layer, the TFT second electrode layer and the capacitor second electrode layer are formed in a shared second electrode layer, the TFT insulation layer and the capacitor insulation layer are formed in a shared insulation layer, and the TFT etching stop layer and the capacitor etching stop layer are formed in a shared etching stop layer. In addition, the shared first electrode layer, the shared etching stop layer, and the shared second electrode layer are sequentially stacked.

Another inventive aspect is a method of manufacturing a TFT array substrate. The method includes sequentially forming a first electrode layer and an insulation layer on a substrate, etching the insulation layer in a storage capacitor area, forming an etching stop layer at a location where the insulation layer is etched, and forming a second electrode layer on the etching stop layer.

BRIEF DESCRIPTION OF THE DRAWINGS

In order to more clearly illustrate the technical solutions of the embodiments of the invention, the drawings used for the description of the embodiments are briefly introduced below. Obviously, the drawings for the following description only show some embodiments of the invention, and other drawings may also be obtained from the described drawings by those skilled in the art without any creative work.

DETAILED DESCRIPTION OF THE INVENTION

Referring to FIGS. 1 to 6, a TFT array substrate 100 and a manufacturing method thereof are provided by a first embodiment of the present invention.

Figure 1:
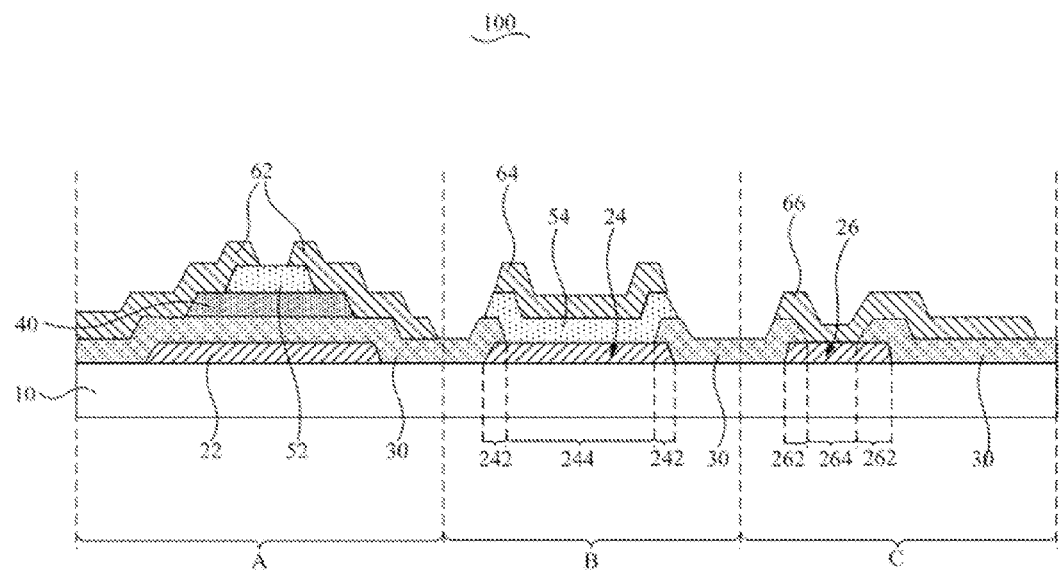
FIG. 1 is a schematic view showing the cross-sectional structure of a TFT array substrate according to a first embodiment of the present invention.

FIG. 1 is a schematic view showing the cross-sectional structure of the TFT array substrate 100. For the sake of explanation, the TFT array substrate 100 includes three areas, i.e. a TFT area A, a storage capacitor area B and a driving circuit area C, in terms of the function of each area. The TFT array substrate 100 structurally includes a substrate 10, first electrode layers 22, 24 and 26, an insulation layer 30, a semiconductor layer 40, etching stop layers 52 and 54, and second electrode layers 62, 64 and 66.

The first electrode layers are formed in the TFT area A, the storage capacitor area B and the driving circuit area C and denoted by 22, 24 and 26, respectively. The first electrode layer may be made of Molybdenum, Molybdenum-Niobium alloy, Aluminum, Aluminum-Neodymium alloy, Copper, Titanium, Nickel, Chromium, or composite layers made by two or more of the above. In the TFT area A, the first electrode layer 22 functions as a gate electrode. In the storage capacitor area B, the upper surface of the first electrode layer 24 includes two first areas 242 and a second area 244, and the first areas are respectively located on both lateral sides of the upper surface of the first electrode layer 24, while the second area 244 is located in the middle of the upper surface of the first electrode layer 24. In the driving circuit area C, the upper surface of the first electrode layer 26 includes two third areas 262 and a fourth area 264, and the third areas 262 are respectively located on both lateral sides of the upper surface of the first electrode layer 26, while the fourth area 264 is located in the middle of the upper surface of the first electrode layer 26. The first electrode layers 22, 24 and 26 are at the same layer in the TFT area A, the storage capacitor area B and the driving circuit area C.

The insulation layer 30 is formed on the first electrode layers 22, 24 and 26. In the TFT area A, the insulation layer 30 functions as a gate insulator layer and covers entirely the surface of the TFT area A. In the storage capacitor area B and the driving circuit area C, a first via hole 32 and second via hole 34 are respectively formed in the insulation layers 30 by etching the insulation layers 30. Herein, the first via hole 32 is used for the electrical connection between the first electrode layer 24 and the second electrode layer 64, and the second via hole 34 is used for the electrical connection between the first electrode layer 26 and the second electrode layer 66. The first via hole 32 is formed in the second area 244 of the first electrode layer 24. The second via hole 34 is formed in the fourth area 264 of the first electrode layer 26. In the storage capacitor area B, the insulation layer 30 is provided in the first areas 242 on both lateral sides of the first electrode layer 24. In the driving circuit area C, the insulation layer 30 is provided in the third areas 262 on both lateral sides of the first electrode layer 26 and provided on the substrate 10. The insulation layer 30 may be made of Silicon Oxide, Silicon Nitride, Aluminum-Oxide, or composite layers made by two or more of the above. The insulation layers 30 are at the same layer in the TFT area A, the storage capacitor area B and the driving circuit area C.

The semiconductor layer 40 is provided on the gate insulator layer 40 in the TFT area A. In the present embodiment, the semiconductor layer 40 may be made by an oxide, such as Indium Gallium Zinc Oxide, Zinc Oxide, Indium Aluminum Zinc Oxide, Gallium Zinc Oxide or Silicon Oxide.

The etching stop layers are provided in the TFT area A and the storage capacitor area B, respectively, and are denoted by 52 and 54, respectively. In the TFT area A, the etching stop layer 52 is deposited on the semiconductor layer 40. In the storage capacitor area B, the etching stop layer 54 is deposited on a part of the first electrode layer 24 that is not covered by the insulation layer 30 (i.e. above the first via hole 32 corresponding to the second area 244 of the first electrode layer) and on a part of the insulation layer 30. The etching stop layer 54 is directly contact with and located between the first electrode layer 24 and the second electrode layer 64. There is no etching stop layer in the driving circuit area C. The etching stop layers 52, 54 may be made of Silicon Oxide, Silicon Nitride, Aluminum Oxide, or composite layers made by two or more of the above, that is, the material of the etching stop layers 52, 54 may be same as the material of the insulation layer 30. The thickness of any one of the etching stop layers is from 300 Å to 3000 Å, and preferably is 1000 Å, for example. The thickness of any one of the etching stop layers is designed to be less than the thickness of the insulation layer 30 in the TFT area A to increase the capacitance per unit of area, thus to further increase the capacitance of the storage capacitor.

The second electrode layers are located in the TFT area A, the storage capacitor area B and the driving circuit area C, respectively, and are denoted by 62, 64 and 66, respectively. The second electrode layers 62, 64 and 66 may be made of Molybdenum, Molybdenum-Niobium alloy, Aluminum, Aluminum-Neodymium alloy, Copper, Titanium, Nickel, Chromium or Indium Tin Oxide. In the TFT area A, the second electrode layers 62, which are top layers, functions as a source electrode and a drain electrode, and the structure of the stacked layers in the TFT area A is known in the prior art. In the storage capacitor area B, the second electrode layer 64 is provided on the etching stop layer 54. The storage capacitor is formed by the first electrode layer 24, the etching stop layer 54 and the second electrode layer 64 which are sequentially stacked. In the driving circuit area C, the second electrode layer 66 is arranged on a part of the first electrode layer 26 that is not covered by the insulation layer 30 (i.e. above the second via hole 34 corresponding to the fourth area 264 of the first electrode layer) and on a part of the insulation layer 30. The second electrode layers 62 and 66 are at the same layer in the TFT area A and the driving circuit area C. With the TFT structure of the present invention, the insulation layer in the storage capacitor area can be etched at the same time when the via holes are formed by etching the insulation layer of the driving circuit, without any additional photolithography process.

FIGS. 2 to 6 illustrate the manufacturing method for the TFT array substrate 100 according to a first embodiment of the present invention.

Figure 2:
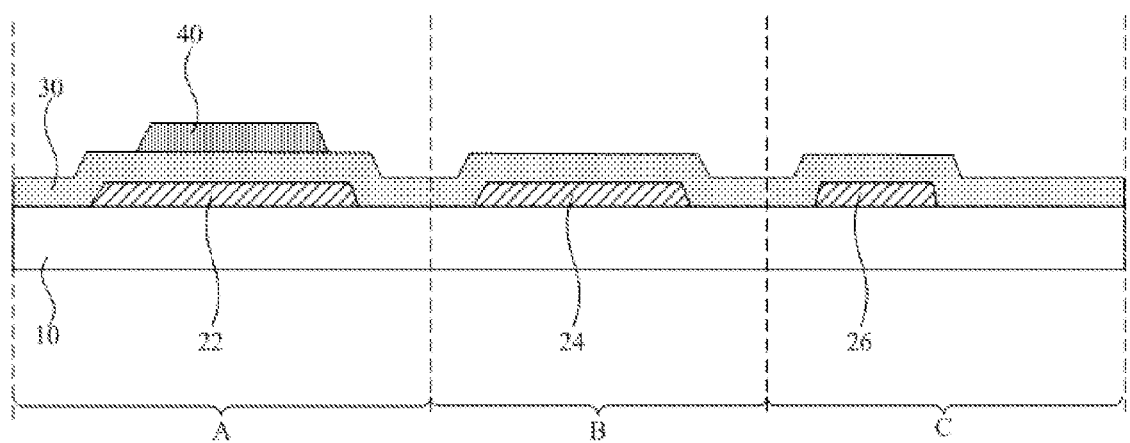
FIG. 2 is a schematic view showing the manufacturing method for the TFT array substrate according to the first embodiment of the present invention.

At Step S1 of the manufacturing method, referring to FIG. 2, a substrate 10 is provided, and the substrate 10 may be made of solid material such as glass or resin. Then, the first electrode layers 22, 24 and 26 are formed by film forming through a first photolithography process.

At Step S2 of the manufacturing method, referring to FIG. 2, an insulation layer 30 is formed on the substrate 10 and covers the first electrode layers 22, 24 and 26.

At Step S3 of the manufacturing method, referring to FIG. 2, the semiconductor layer 40 is provided on the insulation layer 30 in the TFT area A by a second photolithography process.

Figure 3:
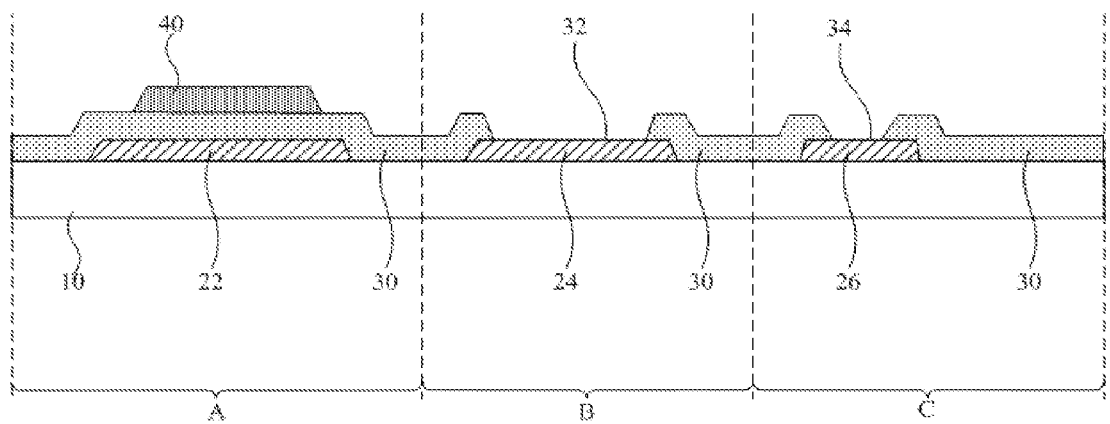
FIG. 3 is a schematic view showing the manufacturing method for the TFT array substrate according to the first embodiment of the present invention.

At Step S4 of the manufacturing method, referring to FIG. 3, a part of the insulation layer 30 is completely etched in both the storage capacitor area B and the driving circuit area C by a third photolithography process to form a first via hole 32 and a second via hole 34.

Figure 4:
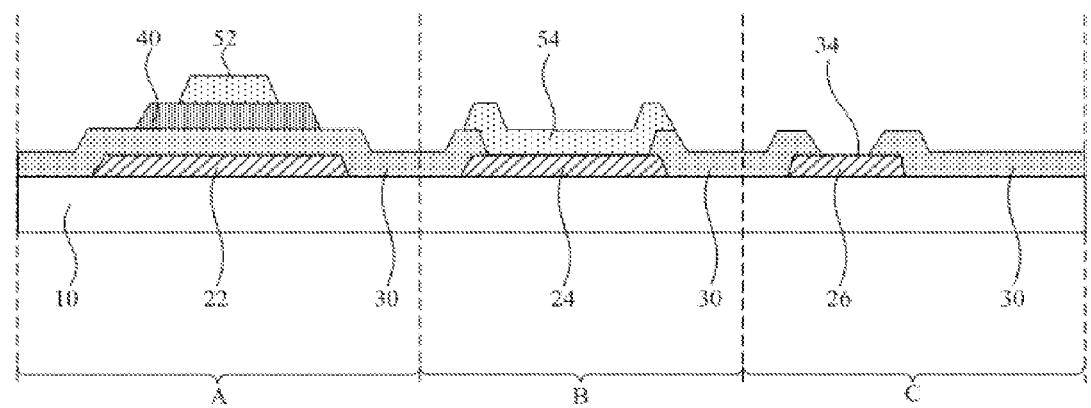
FIG. 4 is a schematic view showing the manufacturing method for the TFT array substrate according to the first embodiment of the present invention.

At Step S5 of the manufacturing method, referring to FIG. 4, the etching stop layers 52 and 52 are deposited on the semiconductor layer 40 in the TFT area A and the second area 244 of the first electrode layer 24 in the storage capacitor area B by a fourth photolithography process.

Figure 5:
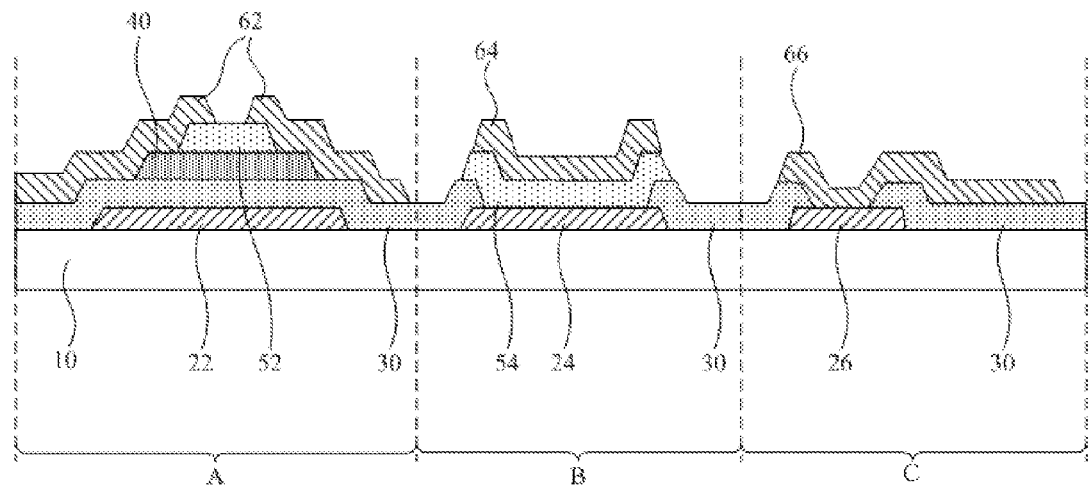
FIG. 5 is a schematic view showing the manufacturing method for the TFT array substrate according to the first embodiment of the present invention.
Figure 6:
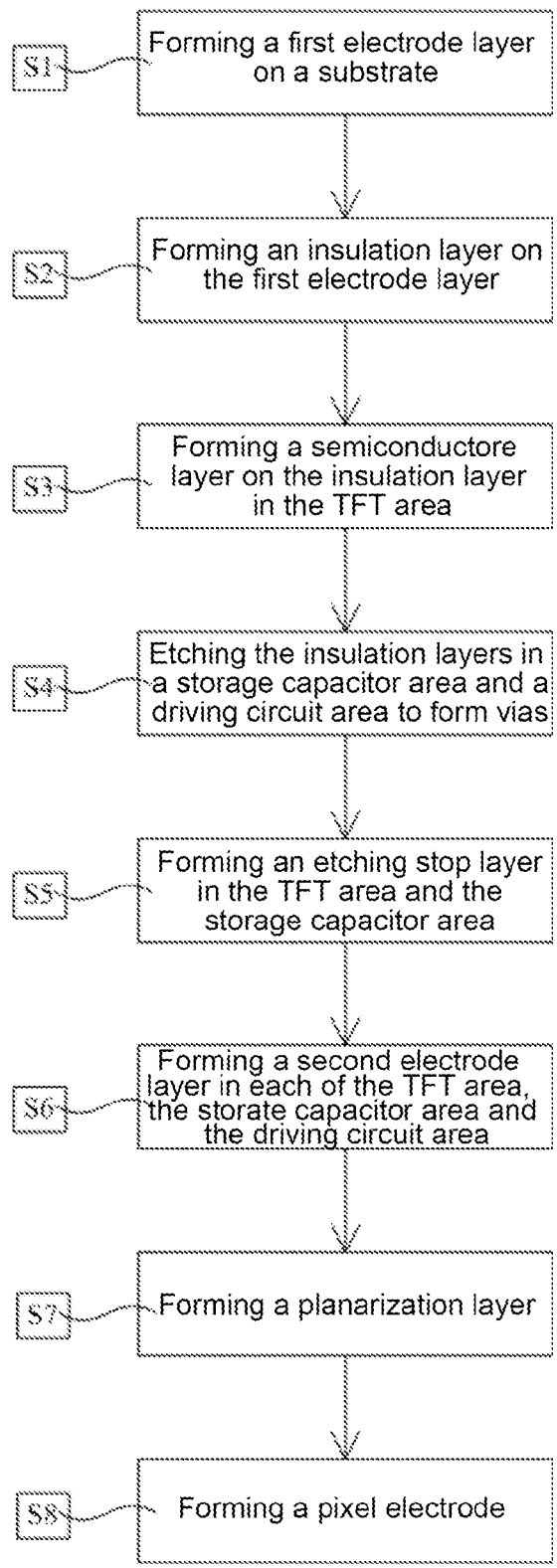
FIG. 6 is a flow chart showing the manufacturing method for the TFT array substrate according to the first embodiment of the present invention.

At Step S6 of the manufacturing method, referring to FIG. 5, the second electrode layers 62, 64 and 66 are provided in the TFT area A, the storage capacitor area B and the driving circuit area C, respectively, by a fifth photolithography process In the case of a Twisted Nematic (TN) display panel, for example, the manufacturing method further includes Steps S7 and S8, which are not shown in FIG. 6. In Step S7, a passivation layer is provided on the entire TFT array substrate 100 by a sixth photolithography process, and then via holes are formed in the passivation layer by etching the passivation layer. In Step S8, an electrode layer is provided on the passivation layer, and then patterned to form a pixel electrode. Finally, the TFT array substrate used for the TN display panel is formed. Steps S7 and S8 are both known in the prior art, and thus will not be repeatedly described here, and the corresponding structure is not illustrated in the drawings.

The film forming for the first electrode layers 22, 24 and 26, the insulation layer 30, the semiconductor layer 40, the etching stop layers 52 and 54, the second electrode layers 62, 64 and 66 may be performed by a physical vapor deposition (PVD) or chemical vapor deposition (CVD) method. The photolithography processes performed in the process of manufacture are known in the prior art, and thus will not be repeatedly described here.

In the TFT array substrate 100 and the manufacturing method thereof provided by a first embodiment of the present invention, a part of the insulation layer 30 in the storage capacitor area B of the TFT array substrate is completely etched to expose the first electrode layer 24, so that the storage capacitor is formed by the first electrode layer 24, the etching stop layer 54 and the second electrode layer 64, with the etching stop layer 54 functioning as a dielectric layer of the storage capacitor, so that the insulation layer 30 is omitted from the storage capacitor, thus the capacitance of the storage capacitor is increased, and the interference caused by the parasitic capacitance is reduced, thereby improving the image display quality of the display panel. In the manufacturing process, the first via hole 32 may be formed in the storage capacitor area B through etching at the same time when the second via hole 34 provided in the driving circuit area C of the present TFT array substrate 100 is formed through etching, for the purpose of forming those three layers of the storage capacitor, without additionally introducing a photolithography process dedicated for the insulation layer 30 in the storage capacitor area B, thus the manufacturing process is accordingly simplified.

Figure 7:
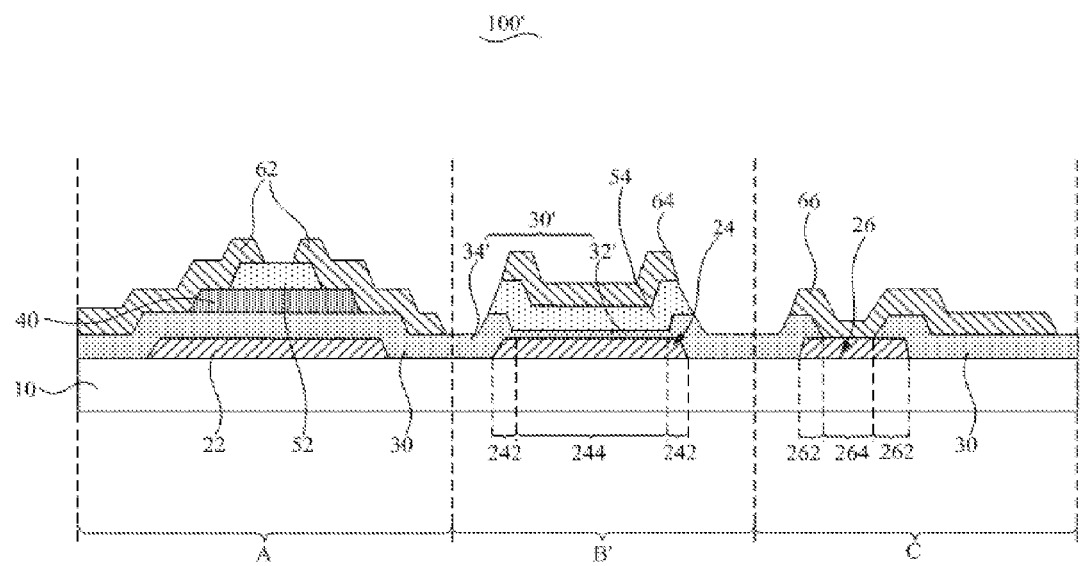
FIG. 7 is a schematic view showing the cross-sectional structure of a TFT array substrate according to a second embodiment of the present invention.
Figure 8:
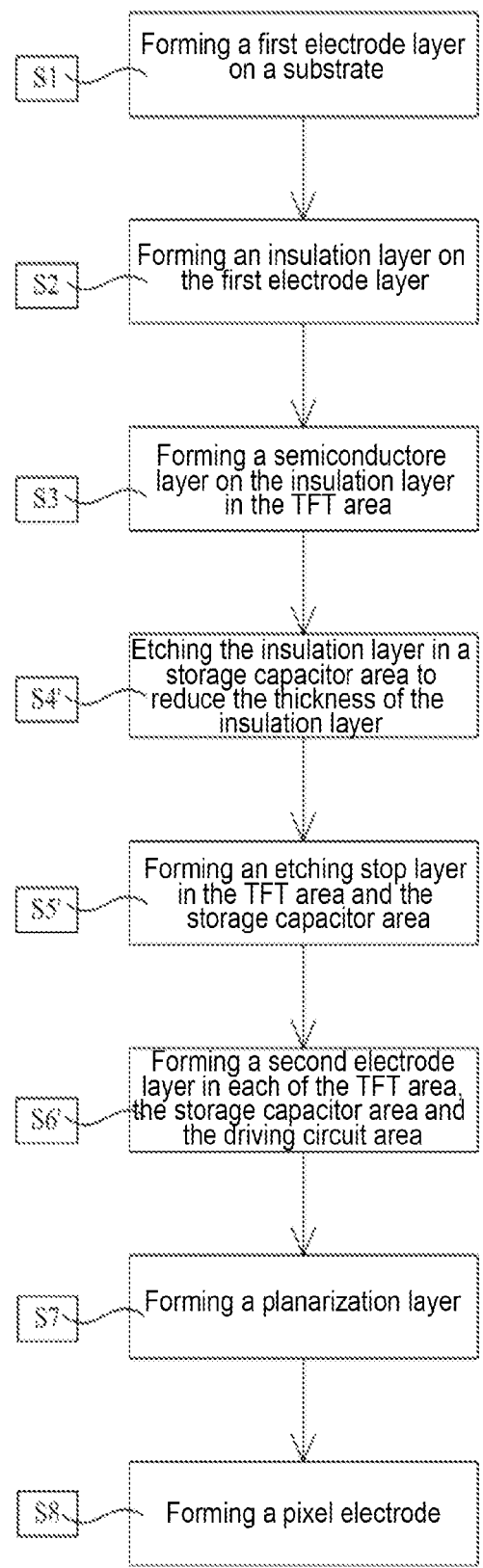
FIG. 8 is a flow chart showing the manufacturing method for the TFT array substrate according to the second embodiment of the present invention.

Referring to FIGS. 7 to 8, a TFT array substrate 100' and a manufacturing process thereof are provided by a second embodiment of the present invention.

As illustrated in FIG. 7, the TFT array substrate 100' is the same as the TFT array substrate 100 provided by a first embodiment, except that the storage capacitor area B' of the TFT array substrate 100' includes four layers, that is, a first electrode layer 24, an insulation layer 30', an etching stop layer 54 and a second electrode layer 64 which are sequentially stacked starting from the substrate 10. In the storage capacitor area B', the insulation layer 30' includes an insulation layer 32' and an insulation layer 34' with a thickness different from that of the insulation layer 32', and the thickness of the insulation layer 32' is less than that of the insulation layer 30 located on the first electrode layer 22 in the TFT area A, and is preferably 10% to 90% of the thickness of the insulation layer 30 in the TFT area A. The thickness of the insulation layer 34' may be designed to be identical as the thickness of the insulation layer 30 located on the first electrode layer 22 in the TFT area A. Accordingly, the etching stop layer 54 is arranged on the insulation layer 30'. The second electrode layer 64 is arranged on the etching stop layer 54.

In the TFT array substrate 100' provided by a second embodiment of the present invention, although the storage capacitor area B' of the TFT array substrate 100' includes four layers, the thickness of the insulation layer 32' among the four layers is reduced, which means that the thickness of the dielectric layer of the storage capacitor is reduced, and the effect achieved by a first embodiment of the present invention can also be achieved by this second embodiment.

FIG. 8 is a flow chart showing the manufacturing method for the TFT array substrate 100' according to a second embodiment of the present invention, and the manufacturing method of a second embodiment is the same as that in the first embodiment except for Steps S4', S5' and S6'. At Step S4', in etching the insulation layer 30' in the storage capacitor area B', the insulation layer 30' is not etched through, instead, the insulation layer 30' is partially etched to reduce the thickness thereof to form the insulation layer 32' with the less thickness in Step S4'. In Step S5', the etching stop layer 54 is deposited on the insulation layer 30' in the storage capacitor area B'. In Step S6', the second electrode layer 64 is provided on the etching stop layer 54 in the storage capacitor area B'.

A display panel employing the above TFT array substrate 100, 100' is further provided by the present invention, but is not shown in the drawings, and the display panel is not limited to the LCD display panel, but may be an OLED display panel.

In the embodiments of the present invention, even though only the TFT array substrate with a metal-oxide semiconductor has been described, the present invention is not limited thereto, and the TFT array substrate may employ the amorphous silicon or polycrystalline silicon semiconductor.

Apparently, those skilled in the art can make many various changes and modifications on the present invention, without departing from the concept and the scope of the present invention. Accordingly, if these changes and modifications fall in the scope of the claims of the present invention and equivalents thereof, the invention intends to cover these changes and modifications.

What is claimed is:

1. A TFT array substrate, comprising:
  a TFT area, comprising
  a TFT first electrode layer,
  a TFT second electrode layer,
  a TFT insulation layer, and
  a TFT etching stop layer,
  a storage capacitor in a storage capacitor area, the storage capacitor comprising:
    a capacitor first electrode layer,
    a capacitor second electrode layer,
    a capacitor insulation layer, and
    a capacitor etching stop layer,
  wherein the TFT first electrode layer and the capacitor first electrode layer are formed in a shared first electrode layer,
  wherein the TFT second electrode layer and the capacitor second electrode layer are formed in a shared second electrode layer,
  wherein the TFT insulation layer and the capacitor insulation layer are formed in a shared insulation layer,
  wherein the TFT etching stop layer and the capacitor etching stop layer are formed in a shared etching stop layer,
  wherein the shared first electrode layer, the shared etching stop layer, and the shared second electrode layer are sequentially stacked,
  wherein the capacitor first electrode layer comprises a capacitor first area and a capacitor second area, wherein at least a portion of the capacitor insulation layer is formed in the capacitor first area, and wherein at least a portion of the capacitor etching stop layer is formed in the capacitor second area and is formed on a part of the capacitor insulation layer.

2. The TFT array substrate according to claim 1, wherein the shared etching stop layer directly contacts the shared first electrode layer and the shared second electrode layer.

3. The TFT array substrate according to claim 1, wherein the array substrate further comprises a driving circuit area, and wherein the driving circuit area comprises:
   a driving circuit first electrode layer formed in the shared first electrode layer,
   a driving circuit insulation layer formed in the shared insulation layer, and
   a driving circuit second electrode layer formed in the shared second electrode layer,
   wherein the driving circuit first electrode layer comprises a third area and a fourth area in the driving circuit area, the driving circuit insulation layer is in the third area, and the second electrode layer is in the fourth area and on a part of the insulation layer.

4. The TFT array substrate according to claim 3, wherein the TFT first electrode layer comprises a gate electrode, the TFT second electrode layer comprises a source electrode and a drain electrode, and the TFT insulation layer is on the first electrode layer.

5. The TFT array substrate according to claim 4, wherein a semiconductor layer is further provided between the TFT insulation layer and a TFT etching stop layer in the TFT area.

6. The TFT array substrate according to claim 5, wherein the semiconductor layer comprises at least one of a metal oxide, amorphous silicon, and polycrystalline silicon.

7. The TFT array substrate according to claim 3, wherein in the storage capacitor area, a capacitor via hole is provided between the capacitor first electrode layer and the capacitor second electrode layer and passes through the capacitor insulation layer, and wherein in the driving circuit area a driving circuit via hole is provided between the driving circuit first electrode layer and the driving circuit second electrode layer.

8. The TFT array substrate according to claim 7, wherein the capacitor etching stop layer is above the via hole in the storage capacitor area.

9. The TFT array substrate according to claim 1, wherein the TFT etching stop layer is thinner than the TFT insulation layer in the TFT area, and the thickness of the TFT etching stop layer is from 300 Å to 3000Å.

10. The TFT array substrate according to claim 1, wherein the TFT etching stop layer is thinner than the TFT insulation layer in the TFT area, and the thickness of the TFT etching stop layer is from 300 Å to 3000 Å.

11. The TFT array substrate according to claim 2, wherein the TFT etching stop layer is thinner than the TFT insulation layer in the TFT area, and the thickness of the TFT etching stop layer is from 300 Å to 3000 Å.

12. The TFT array substrate according to claim 1, wherein the thickness of at least a part of the capacitor insulation layer located above the capacitor first electrode layer in the storage capacitor area is less than the thickness of the TFT insulation layer located above the TFT first electrode layer in the TFT area.

13. The TFT array substrate according to claim 12, further comprising:
   a driving circuit area comprising:
   a driving circuit first electrode layer formed in the shared first electrode layer,
   a driving circuit insulation layer formed in the shared insulation layer, and
   a driving circuit second electrode layer formed in the shared second electrode layer, and
   a driving circuit via hole in the driving circuit insulation layer to electrically connect the driving circuit first electrode layer to the driving circuit second electrode layer.

14. The TFT array substrate according to claim 12, wherein the thickness of at least a part of the capacitor insulation layer in the storage capacitor area is 10% to 90% of the thickness of the TFT insulation layer in the TFT area.

15. The TFT array substrate according to claim 1, wherein the capacitor etching stop layer in the storage capacitor area is thinner than the TFT insulation layer in the TFT area, and the thickness of the shared etching stop layer is 300 Å to 3000 Å.

16. A display panel, comprising a TFT array substrate, Wherein the TFT array substrate comprises:
   a TFT area, comprising
   a TFT first electrode layer,
   a TFT second electrode layer,
   a TFT insulation layer, and
   a TFT etching stop layer,
   a storage capacitor in a storage capacitor area, the storage capacitor comprising:
   a capacitor first electrode layer,
   a capacitor second electrode layer,
   a capacitor insulation layer, and
   a capacitor etching stop layer,
   wherein the TFT first electrode layer and the capacitor first electrode layer are formed in a shared first electrode layer,
   wherein the TFT second electrode layer and the capacitor second electrode layer are formed in a shared second electrode layer,
   wherein the TFT insulation layer and the capacitor insulation layer are formed in a shared insulation layer,
   wherein the TFT etching stop layer and the capacitor etching stop layer are formed in a shared etching stop layer,
   wherein the shared first electrode layer, the shared etching stop layer, and the shared second electrode layer are sequentially stacked,
   wherein the capacitor first electrode layer comprises a capacitor first area and a capacitor second area, wherein at least a portion of the capacitor insulation layer is formed in the capacitor first area, and wherein at least a portion of the capacitor etching stop layer is formed in the capacitor second area and is formed on a part of the capacitor insulation layer.

* * * * *